United States Patent
Sutardja

(10) Patent No.: US 9,641,359 B1
(45) Date of Patent: *May 2, 2017

(54) APPARATUS AND METHOD FOR ACCOUNTING FOR GAIN AND PHASE ERROR INTRODUCED BY A FIRST FILTER BY ADJUSTING COEFFICIENTS OF A SECOND FILTER

(71) Applicant: Marvell International Ltd., Hamilton (BM)

(72) Inventor: Pantas Sutardja, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 15/098,639

(22) Filed: Apr. 14, 2016

Related U.S. Application Data

(63) Continuation of application No. 14/091,514, filed on Nov. 27, 2013, now Pat. No. 9,319,024, which is a continuation of application No. 13/632,612, filed on Oct. 1, 2012, now Pat. No. 8,599,975, which is a continuation of application No. 13/329,987, filed on Dec. 19, 2011, now Pat. No. 8,279,984, which is a continuation of application No. 12/372,832, filed on Feb. 18, 2009, now Pat. No. 8,081,720, which is a continuation of application No. 10/788,998, filed on Feb. 27, 2004, now Pat. No. 7,505,537.

(60) Provisional application No. 60/457,717, filed on Mar. 25, 2003.

(51) Int. Cl.
*G06F 17/10* (2006.01)
*H04L 25/03* (2006.01)
*H04L 27/08* (2006.01)

(52) U.S. Cl.
CPC ........ *H04L 25/03019* (2013.01); *H04L 27/08* (2013.01)

(58) Field of Classification Search
CPC .............. H04L 7/042; H04B 7/06; H04B 7/15
USPC .................. 708/300, 322–323; 375/232–233
See application file for complete search history.

(56) References Cited

U.S. PATENT DOCUMENTS

| | | | |
|---|---|---|---|
| 4,757,519 | A | 7/1988 | Collison et al. |
| 5,243,624 | A | 9/1993 | Paik et al. |
| 5,299,004 | A | 3/1994 | Joo et al. |
| 5,473,699 | A | 12/1995 | Tamamura et al. |
| 5,493,585 | A | 2/1996 | Leverington et al. |
| 5,512,959 | A | 4/1996 | D'Alto et al. |
| 5,825,318 | A | 10/1998 | Patapoutian et al. |

(Continued)

FOREIGN PATENT DOCUMENTS

WO    WO-0178339 A1    10/2001

*Primary Examiner* — Tan V. Mai

(57) ABSTRACT

A system including first and second filters and an adaptation engine. The first filter includes first taps that receive first coefficients and filters a digital signal to generate a first filtered signal. One of the first coefficients is constrained, such that the one of the first coefficients are not updated and phase and gain errors are introduced. The second filter includes second taps that receive second coefficients and filters the first filtered signal to generate a second filtered signal. The second coefficients include first and second coefficients. The adaptation engine, based on the one of the first coefficients, updates: the first coefficient to set a phase of the second filter; and the second coefficient to set a gain of the second filter. The phase of the second filter corresponds to a change in the phase error. The gain of the second filter corresponds to a change in the gain error.

20 Claims, 8 Drawing Sheets

(56) References Cited

U.S. PATENT DOCUMENTS

| | | |
|---|---|---|
| 5,862,007 A | 1/1999 | Pham et al. |
| 5,995,545 A | 11/1999 | Ueno |
| 5,999,355 A | 12/1999 | Behrens et al. |
| 6,208,481 B1 | 3/2001 | Spurbeck et al. |
| 6,249,398 B1 | 6/2001 | Fisher et al. |
| 6,272,173 B1 | 8/2001 | Hatamian |
| 6,381,085 B1 | 4/2002 | Du et al. |
| 6,389,069 B1 | 5/2002 | Mathe |
| 6,449,110 B1 | 9/2002 | DeGroat et al. |
| 6,477,200 B1 | 11/2002 | Agazzi et al. |
| 6,513,141 B1 | 1/2003 | Livingston |
| 6,526,105 B1 | 2/2003 | Harikumar et al. |
| 6,594,098 B1 | 7/2003 | Sutardja |
| 6,707,407 B2 | 3/2004 | Troy et al. |
| 6,804,695 B1 | 10/2004 | Hsu |
| 6,819,514 B1 | 11/2004 | Behrens et al. |
| 6,829,296 B1 | 12/2004 | Troulis et al. |
| 6,980,592 B1 | 12/2005 | Rambaud et al. |
| 7,006,565 B1 | 2/2006 | Endres et al. |
| 7,012,772 B1 | 3/2006 | Vis |
| 7,046,726 B2 | 5/2006 | Jayaraman et al. |
| 7,313,198 B2 | 12/2007 | Rahman et al. |
| 7,386,044 B2 | 6/2008 | Yousef |
| 7,505,537 B1 | 3/2009 | Sutardja |
| 7,526,019 B1 | 4/2009 | Radionov et al. |
| 8,081,720 B1 | 12/2011 | Sutardja |
| 8,279,984 B1 | 10/2012 | Sutardja |
| 8,599,975 B1 | 12/2013 | Sutardja |
| 2003/0112861 A1 | 6/2003 | Erdogan et al. |

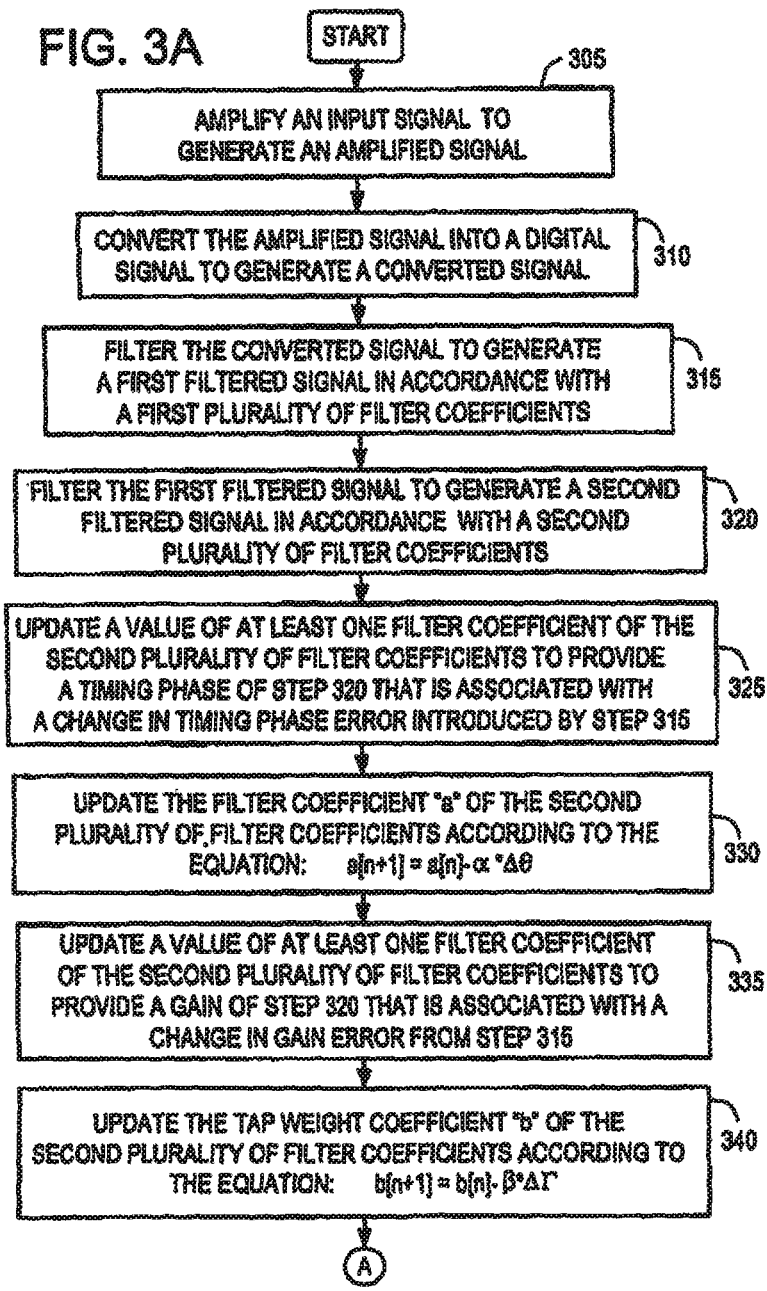

APPARATUS AND METHOD FOR ACCOUNTING FOR GAIN AND PHASE ERROR INTRODUCED BY A FIRST FILTER BY ADJUSTING COEFFICIENTS OF A SECOND FILTER

CROSS-REFERENCE TO RELATED APPLICATIONS

The present disclosure is a continuation of U.S. application Ser. No. 14/091,514, filed Nov. 27, 2013, which is a continuation of U.S. application Ser. No. 13/632,612 (now U.S. Pat. No. 8,599,975), filed Oct. 1, 2012, which is a continuation of U.S. application Ser. No. 13/329,987 (now U.S. Pat. No. 8,279,984), filed Dec. 19, 2011, which is a continuation of U.S. application Ser. No. 12/372,832 (now U.S. Pat. No. 8,081,720), filed Feb. 18, 2009, which is a continuation of U.S. application Ser. No. 10/788,998 (now U.S. Pat. No. 7,505,537), filed Feb. 27, 2004, which claims priority under 35 U.S.C. §119(e) to U.S. Provisional Application No. 60/457,717, filed Mar. 25, 2003. The entire disclosures of the applications referenced above are incorporated herein by reference.

FIELD

The present disclosure relates to Least Mean Square (LMS) filters. More particularly, the present disclosure relates to a system and method for controlling gain and timing phase in the presence of a first LMS filter using a second adaptive filter.

BACKGROUND

The Least Mean Square (LMS) adaptation algorithm is known to provide good error rate performance for sequence detectors in applications such as, for example, digital data detectors (e.g., read channel devices for magnetic recording), data communication and the like. The LMS algorithm is updated according to Equation (1):

$$C_N(n+1)=C_N(n)+\mu*E(n)*X_N(n) \quad (1)$$

According to Equation (1), $C_N(n+1)$ is a vector of N tap weight coefficients of a filter for the next iteration (i.e., the next time sampling interval of the input signal), i.e., $C_N(n+1)=[C_0(n+1), C_1(n+1), \ldots, C_{N-1}(n+1)]$. The filter can be, for example, a Finite Impulse Response (FIR) filter or an Infinite Impulse Response filter. A FIR filter produces an output that is a weighted sum of the current and past inputs to the filter. An IIR filter produces an output that is a weighted sum of the current and past inputs to the filter and past outputs of the filter. In Equation (1), $C_N(n)$ is a vector of N tap weight coefficients of the filter for the current iteration (i.e., the current sampling interval of the input signal), i.e., $C_N(n)=[C_0(n), C_1(n), \ldots, C_{N-1}(n)]$. The gain constant or step-size parameter $\mu$ is a scalar value that generally controls the rate at which the LMS algorithm converges, with its value generally being between, for example, zero and one. $E(n)$ is a scalar value representing the error between the value of the signal input to the filter and the ideal noiseless value of that input signal. For data communication, an output of the filter can be in communication with an input of a sequence detector, and an output of the sequence detector can be in communication with an input of a reconstruction filter, a target channel response filter, or the like. The ideal noiseless value can be estimated by convolving the output of the sequence detector with the target channel response. In Equation (1), $X_N(n)$ is a vector of N delayed input samples to the filter, i.e., $X_N(n)=[X(k), X(k-1), \ldots, X(k-(N-1))]$.

In data communication receivers with gain recovery and/or timing phase recovery, it is generally necessary to constrain the LMS algorithm to minimize the interaction between the LMS adaptation and the gain and timing phase recovery. For example, for a filter having tap weight coefficients updated according to the LMS algorithm, at least two of the main tap weight coefficients of the filter can be constrained and not adapted. A Zero-Forcing (ZF) Automatic Gain Control (AGC) algorithm can be used to control the gain of the system. In such a configuration, there can be an undesirable interaction between the filter having tap weight coefficients updated according to the LMS algorithm and the ZF AGC. In the presence of signal noise, minimization of the Mean Square Error (MSE) by the LMS algorithm on the input signal through the filter can require that the gain of the system be slightly lowered relative to the noiseless case. However, the ZF AGC algorithm generally does not make adjustments to the overall gain setting, even in the presence of noise. With the ZF AGC algorithm maintaining a higher gain than desired by the filter having tap weight coefficients updated according to the LMS algorithm, the resultant higher-gain situation can cause the constrained LMS algorithm to converge to a sub-optimal state that can be far from the optimal error rate performance of the data receiver.

In addition, there can be another bias (or biases) in the timing phase recovery of the data receiver. This can be caused by, for example, implementation inaccuracy (e.g., quantization effects), data pattern dependencies (e.g., highly asymmetric waveforms), and the like. The constrained LMS algorithm generally cannot correct for the bias condition properly, because two or more of the main tap weight coefficients of the filter are not allowed to adapt. Consequently, the tap weight coefficients that are allowed to adapt can over-correct, which can result in the tap weight coefficients of the filter converging to a state that also yields sub-optimal error rate performance.

SUMMARY

A system is provided and includes a first filter, a first device, a second filter and a second device. The first filter includes first taps. The first taps are configured to receive respective coefficients, and wherein the first filter is configured to receive an input signal, and based on the coefficients, filter the input signal. The first device is configured to update some of the coefficients based on the input signal. The first device does not update one of the coefficients. The second filter includes second taps. The second taps are configured to receive respectively a first coefficient and a second coefficient. The second filter is configured to, based on the first coefficient and the second coefficient, filter an output of the first filter. The second device is configured to, based on the output of the first filter, update the second coefficient to account for a change in: an amount of gain of the system not accounted for by the first device due to the one of the coefficients of the first taps not being updated; and a timing phase error of the input signal as a result of the first device not updating the one of the coefficients of the first taps.

In other features, a method is provided and includes: receiving an input signal at a first filter; receiving coefficients respectively at first taps of the first filter; based on the coefficients, filtering the input signal at the first filter; updating some of the coefficients based on the input signal, wherein one of the coefficients is not updated; and receiving a first coefficient and a second coefficient respectively at second taps of a second filter. The method further includes: based on the first coefficient and the second coefficient, filtering an output of the first filter at the second filter; and based on the output of the first filter, updating the second coefficient to account for a change in (i) an amount of gain not accounted for due to the one of the coefficients of the first taps not being updated, and a timing phase error of the input signal as a result of not updating the one of the coefficients of the first taps.

In other features, a system is provided and includes a first filter configured to generate a first output signal based on an input signal. The first filter includes N tap weight coefficients, where N is an integer greater than 1. A first device is configured to update the N tap weight coefficients of the first filter. A second filter is configured to generate a second output signal in response to the first output signal. The second filter includes M tap weight coefficients, where M is an integer greater than 1 and less than N. A second device is configured to determine a value of a first one of the M tap weight coefficients for each of multiple sampling times of the input signal. The second device is configured to update the first one of the M tap weight coefficients based on the values of the first one of the M tap weight coefficients, a first gain constant, and a change in timing phase error of the first filter.

A method and system are disclosed for controlling gain and timing phase in the presence of a first Least Mean Square (LMS) filter using a second adaptive filter. In accordance with a first aspect of the present disclosure, an information communication system can include a variable gain amplifier (VGA). The VGA can be responsive to an input signal of the information communication system. The information communication system can include an analog-to-digital converter (ADC). The ADC can be responsive to an output of the VGA. The information communication system can include a first filter. Tap weight coefficients of the first filter can be updated according to a first least mean square (LMS) engine. The first filter can be responsive to an output of the ADC. At least one tap weight coefficient of the first filter can be constrained. The information communication system can include a second filter. Tap weight coefficients of the second filter can be updated according to an adaptation engine. The adaptation engine can compromise a second LMS engine or a zero-forcing engine. The second filter can be responsive to an output of the first filter. The number of tap weight coefficients of the second filter can be less than or equal to the number of the tap weight coefficients of the first filter. The information communication system can include either or both of a gain controller for controlling gain of the VGA, wherein the gain controller can in communication with the VGA and responsive to the output of the second filter, and a timing phase controller for controlling timing phase of the ADC, wherein the timing phase controller can be in communication with the ADC and responsive to an output of the second filter.

According to the first aspect, at least two tap weight coefficients of the first filter can be constrained. A value of at least one tap weight coefficient of the second filter can be updated to provide a gain of the second filter that is associated with a change in gain error from the first filter. The gain of the second filter can be configured to cause the gain controller to modify a gain of the VGA to compensate for the change in gain error from the first filter. Additionally or alternatively, a value of at least one tap weight coefficient of the second filter can be updated to provide a timing phase of the second filter that is associated with a change in timing phase error introduced by the first filter. The timing phase of the second filter can be configured to cause the timing phase controller to modify a timing phase of the ADC to compensate for the change in timing phase error introduced by the first filter.

According to the first aspect, the second filter can include either a two-tap filter or a three-tap filter. For example, the tap weight coefficients of the two-tap filter can include "a" and "1+b", respectively, and the tap weight coefficients of the three-tap filter can include "a", "1+b", and "−a", respectively. The tap weight coefficient "a" can be updated according to the equation:

$$a[n+1]=a[n]-\alpha*\Delta\theta,$$

wherein $a[n+1]$ includes the value of the tap weight coefficient "a" for the next sampling time of the input signal, $a[n]$ includes the value of the tap weight coefficient "a" for the current sampling time of the input signal, $\alpha$ includes a first gain constant, and $\Delta\theta$ includes the change in timing phase error associated with the first filter.

According to the first aspect, the first filter can include N tap weight coefficients, wherein N includes at least four. For purposes of illustration and not limitation, a third tap weight coefficient $C_3$ and a fourth tap weight coefficient $C_4$ of the first filter can be constrained. Thus, $\Delta\theta$ can be updated according to the equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to the equations:

$$\Delta C_3=\mu*E[n]*X[n-3] \text{ and}$$

$$\Delta C_4=\mu*E[n]*X[n-4], \text{ respectively,}$$

wherein $\mu$ includes a second gain constant, $E[n]$ includes an error signal for the current sampling time of the input signal, $X[n-3]$ includes the value of the input signal at the third previous sampling time of the input signal, and $X[n-4]$ includes the value of the input signal at the fourth previous sampling time of the input signal. According to the first aspect, $K_e$ and $K_o$ can be updated according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein $\gamma$ includes a "+1" when $((2*n) \text{ modulo } 4)=0$ and includes a "−1" otherwise, M can be determined according to the equation:

$$M=\text{TRUNCATE}((N-1)/2), \text{ and}$$

P can be determined according to the equation:

$$P=\text{TRUNCATE}(((N-1)/2)-0.5).$$

According to the first aspect, $K_e$ and $K_o$ can each include a predetermined value. The error signal $E[n]$ can include the difference between an output of the first filter and the output of a reconstruction filter. The reconstruction filter can be responsive to an output of a sequence detector. The sequence detector can be responsive to an output of the first filter.

According to the first aspect, the first filter can include N tap weight coefficients, wherein N includes at least four. For purposes of illustration and not limitation, a third tap weight coefficient $C_3$ and a fourth tap weight coefficient $C_4$ of the first filter can be constrained. Thus, $\Delta\theta$ can be updated according to the equation:

$\Delta\theta=(-\Delta C_3 * K_e - \Delta C_4 * K_o)$, wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein $\mu$ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal. According to the first aspect, $K_e$ and $K_o$ can be updated according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein $\gamma$ includes a "+1" when ((2*n) modulo 4)=0 and includes a "−1" otherwise, M can be determined according to the equation:

$M=\text{TRUNCATE}((N-1)/2)$, and

P can be determined according to the equation:

$P=\text{TRUNCATE}(((N-1)/2)-0.5)$.

According to the first aspect, $K_e$ and $K_o$ can each include a predetermined value.

According to the first aspect, the information communication system can include a sequence detector. The sequence detector can be responsive to an output of the first filter. The information communication system can include a reconstruction filter. The reconstruction filter can be responsive to an output of the sequence detector. The information communication system can also include an error generator. The error generator can be responsive to the output of the first filter and an output of the reconstruction filter. The error generator can generate the error signal E[n] including a difference between the output of the first filter and the output of the reconstruction filter.

According to the first aspect, the tap weight coefficient "b" can be updated according to the equation:

$b[n+1]=b[n]-\beta*\Delta\Gamma$, wherein b[n+1] includes the value of the tap weight coefficient "b" for the next sampling time of the input signal, b[n] includes the value of the tap weight coefficient "b" for the current sampling time of the input signal, β includes a first gain constant, and $\Delta\Gamma$ includes the change in gain absent from the first filter. According to the first aspect, the first filter can include N tap weight coefficients, wherein N includes at least four. For purposes of illustration and not limitation, a third tap weight coefficient $C_3$ and a fourth tap weight coefficient $C_4$ of the first filter can be constrained. Thus, $\Delta\Gamma$ can be updated according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein $\mu$ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal. According to the first aspect, $K_e$ and $K_o$ can be updated according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein $\gamma$ includes a "+1" when ((2*n) modulo 4)=0 and includes a "−1" otherwise, M can be determined according to the equation:

$M=\text{TRUNCATE}((N-1)/2)$, and

P can be determined according to the equation:

$P=\text{TRUNCATE}(((N-1)/2)-0.5)$.

According to the first aspect, $K_e$ and $K_o$ can each include a predetermined value. The error signal E[n] can include the difference between the output of the first filter and the output of the reconstruction filter.

According to the first aspect, the first filter can include N tap weight coefficients, wherein N includes at least four. For purposes of illustration and not limitation, a third tap weight coefficient $C_3$ and a fourth tap weight coefficient $C_4$ of the first filter can be constrained. Thus, $\Delta\Gamma$ can be updated according to the equation:

$\Delta\Gamma=(-\Delta C_3 * K_o + \Delta C_4 * K_e)$, wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein $\mu$ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal. According to the first aspect, $K_e$ and $K_o$ can be updated according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein γ includes a "+1" when ((2*n) modulo 4)=0 and includes a "−1" otherwise, M can be determined according to the equation:

$M$=TRUNCATE(($N$−1)/2), and

P can be determined according to the equation:

$P$=TRUNCATE((($N$−1)/2)−0.5).

According to the first aspect, $K_e$ and $K_o$ can each include a predetermined value. The error signal E[n] can include the difference between the output of the first filter and the output of the reconstruction filter.

According to the first aspect, the information communication system can include an error generator responsive to an output of the reconstruction filter. The error generator can be in communication between an output of the second filter and inputs of the timing phase controller and the gain controller. According to the first aspect, the timing phase controller can include the error generator. The timing phase controller can be responsive to the output of the reconstruction filter. The gain controller can include the error generator. The gain controller can be responsive to the output of the reconstruction filter. The first filter and the second filter can each include a Finite Impulse Response filter. According to the first aspect, a disk drive can include the information communication system. At least the VGA, ADC, first filter, second filter, and at least one of the timing phase controller and gain controller can be formed on a monolithic substrate. The information communication system can be compliant with a standard selected from the group consisting of 802.11, 802.11a, 802.11b, 802.11g and 802.11i.

According to a second aspect, a method for controlling at least one of gain and timing phase can include the steps of: a.) amplifying an input signal to generate an amplified signal; b.) converting the amplified signal into a digital signal to generate a converted signal; c.) filtering the converted signal to generate a first filtered signal in accordance with a first plurality of filter coefficients, wherein the first plurality of filter coefficients are updated according to a first LMS process, and wherein at least one filter coefficient of the first plurality of filter coefficients is constrained; d.) filtering the first filtered signal to generate a second filtered signal in accordance with a second plurality of filter coefficients, wherein the second plurality of filter coefficients of the second filter are updated according to an adaptation process, and wherein a number of filter coefficients of the second plurality of filter coefficients includes one of less than and equal to a number of the filter coefficients of the first plurality of filter coefficients; e.) controlling a gain of step (a.) in response to the second filtered signal; and f.) controlling a timing phase of step (b.) in response to the second filtered signal. The adaptation process used to update the second plurality of filter coefficients can include a second LMS process or a zero-forcing process.

According to the second aspect, at least two filter coefficients of the first plurality of filter coefficients can be constrained. The method can include the steps of: g.) updating a value of at least one filter coefficient of the second plurality of filter coefficients to provide a gain of step (d.) that is associated with a change in gain absent from step (c.); and h.) modifying the gain of step (a.) based upon the gain of step (d.), to compensate for the change in gain error from step (c.). Additionally or alternatively, the method can include the steps of: g.) updating a value of at least one filter coefficient of the second plurality of filter coefficients to provide a timing phase of step (d.) that is associated with a change in timing phase introduced by step (c.); and h.) modifying a timing phase of step (b.) based upon the timing phase of step (d.), to compensate for the change in timing phase introduced by step (c.).

According to the second aspect, the second plurality of filter coefficients can include two or three filter coefficients. The two filter coefficients of the second plurality of filter coefficients can include "a" and "1+b", respectively, and the three filter coefficients of the second plurality of filter coefficients can include "a", "1+b", and "−a", respectively. The method can include the step of: g.) updating the filter coefficient "a" according to the equation:

$a[n+1]=a[n]-\alpha*\Delta\theta$, wherein a[n+1] includes the value of the tap weight coefficient "a" for the next sampling time of the input signal, a[n] includes the value of the tap weight coefficient "a" for the current sampling time of the input signal, α includes a first gain constant, and Δθ includes the change in timing phase error associated with step (c.).

According to the second aspect, the first plurality of filter coefficients can include N filter coefficients, wherein N includes at least four. For purposes of illustration and not limitation, a third filter coefficient $C_3$ and a fourth filter coefficient $C_4$ of the first plurality of filter coefficients can be constrained. The method can include the steps of: h.) updating Δθ according to the equation:

$$\Delta\theta = \frac{(-\Delta C_3 * K_e + \Delta C_4 * K_o)}{K_e^2 + K_o^2},$$

wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein μ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal; and i.) updating $K_e$ and $K_o$ according to the equations:

$$K_e = \sum_{n=0}^{M} \gamma C_{2n}, \text{ and}$$

$$K_o = \sum_{n=0}^{P} \gamma C_{2n+1}, \text{respectively,}$$

wherein γ includes a "+1" when ((2*n) modulo 4)=0 and includes a "−1" otherwise, M can be determined according to the equation:

$M$=TRUNCATE(($N$−1)/2), and

P can be determined according to the equation:

$P$=TRUNCATE((($N$−1)/2)−0.5).

According to the second aspect, $K_e$ and $K_o$ can each include a predetermined value. The method can further include the steps of: i.) detecting an information sequence in the first filtered signal; j.) reconstructing an information signal from the detected information sequence; and k.) generating the error signal E[n] including a difference between the first filtered signal and the reconstructed information signal.

According to the second aspect, the first plurality of filter coefficients can include N filter coefficients, wherein N includes at least four. For purposes of illustration and not limitation, a third filter coefficient $C_3$ and a fourth filter coefficient $C_4$ of the first plurality of filter coefficients can be constrained. The method can include the steps of: h.) updating Δθ according to the equation:

$\Delta\theta = (-\Delta C_3 * K_e - \Delta C_4 * K_o)$, wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein μ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal; and i.) updating $K_e$ and $K_o$ according to the equations:

$$K_e = \sum_{n=0}^{M} \gamma C_{2n}, \text{and}$$

$$K_o = \sum_{n=0}^{P} \gamma C_{2n+1}, \text{respectively,}$$

wherein γ includes a "+1" when ((2*n) modulo 4)=0 and includes a "−1" otherwise, M can be determined according to the equation:

$M$=TRUNCATE(($N$−1)/2), and

P can be determined according to the equation:

$P$=TRUNCATE((($N$−1)/2)−0.5).

According to the second aspect, $K_e$ and $K_o$ can each include a predetermined value. The method can further include the steps of: i.) detecting an information sequence in the first filtered signal; j.) reconstructing an information signal from the detected information sequence; and k.) generating the error signal E[n] including a difference between the first filtered signal and the reconstructed information signal.

According to the second aspect, the method can include the step of: g.) updating the tap weight coefficient "b" according to the equation:

$b[n+1]=b[n]-\beta*\Delta\Gamma$ wherein b[n+1] includes the value of the tap weight coefficient "b" for the next sampling time of the input signal, b[n] includes the value of the tap weight coefficient "b" for the current sampling time of the input signal, β includes a first gain constant, and ΔΓ includes the change in gain error from step (c.). According to the second aspect, the first plurality of filter coefficients can include N filter coefficients, wherein N includes at least four. For purposes of illustration and not limitation, a third filter coefficient $C_3$ and a fourth filter coefficient $C_4$ of the first plurality of filter coefficients can be constrained. The method can include the steps of: h.) updating ΔΓ according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to the equations:

$\Delta C_3 = \mu * E[n] * X[n-3]$ and $\Delta C_4 = \mu * E[n] * X[n-4]$, respectively, wherein μ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal; and i.) updating $K_e$ and $K_o$ according to the equations:

$$K_e = \sum_{n=0}^{M} \gamma C_{2n}, \text{and}$$

$$K_o = \sum_{n=0}^{P} \gamma C_{2n+1}, \text{respectively,}$$

wherein γ includes a "+1" when ((2*n) modulo 4)=0 and includes a "−1" otherwise, M can be determined according to the equation:

$M$=TRUNCATE(($N$−1)/2), and

P can be determined according to the equation:

$P$=TRUNCATE((($N$−1)/2)−0.5).

According to the second aspect, $K_e$ and $K_o$ can each include a predetermined value. The method can further include the steps of: i.) detecting an information sequence in the first filtered signal; j.) reconstructing an information signal from the detected information sequence; and k.) generating the error signal E[n] including a difference between the first filtered signal and the reconstructed information signal.

According to the second aspect, the first plurality of filter coefficients can include N filter coefficients, wherein N includes at least four. For purposes of illustration and not limitation, a third filter coefficient $C_3$ and a fourth filter coefficient $C_4$ of the first plurality of filter coefficients can be constrained. The method can include the steps of: h.) updating $\Delta\Gamma$ according to the equation:

$$\Delta\Gamma = (-\Delta C_3 * K + \Delta C_4 * K_e),$$

wherein $\Delta C_3$ and $\Delta C_4$ are updated according to the equations:

$$\Delta C_3 = \mu * E[n] * X[n-3] \text{ and}$$

$$\Delta C_4 = \mu * E[n] * X[n-4], \text{ respectively,}$$

wherein $\mu$ includes a second gain constant, $E[n]$ includes an error signal for the current sampling time of the input signal, $X[n-3]$ includes the value of the input signal at the third previous sampling time of the input signal, and $X[n-4]$ includes the value of the input signal at the fourth previous sampling time of the input signal; and i.) updating $K_e$ and $K_o$ according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein $\gamma$ includes a "+1" when ((2*n) modulo 4)=0 and includes a "−1" otherwise, M can be determined according to the equation:

$$M = \text{TRUNCATE}((N-1)/2), \text{ and}$$

P can be determined according to the equation:

$$P = \text{TRUNCATE}(((N-1)/2) - 0.5).$$

According to the second aspect, $K_e$ and $K_o$ can each include a predetermined value. The method can further include the steps of: i.) detecting an information sequence in the first filtered signal; j.) reconstructing an information signal from the detected information sequence; and k.) generating the error signal $E[n]$ including a difference between the first filtered signal and the reconstructed information signal.

According to the second aspect, the method can include the steps of: g.) detecting an information sequence in the first filtered signal; h.) reconstructing an information signal from the detected information sequence; and i.) generating an error signal, wherein the error signal is associated with the reconstructed information signal. The method can be compliant with a standard selected from the group consisting of 802.11, 802.11a, 802.11b, 802.11g and 802.11i.

According to a third aspect, an information communication system can include means for amplifying an input signal received by the information communication system to generate an amplified signal. The information communication system can include means for converting the amplified signal into a digital signal to generate a converted signal. The information communication system can include first means for filtering the converted signal to generate a first filtered signal. Tap weight coefficients of the first means for filtering can be updated according to a first LMS adaptation means. At least one tap weight coefficient of the first means for filtering is constrained. The information communication system can include second means for filtering the first filtered signal to generate a second filtered signal. Tap weight coefficients of the second means for filtering can be updated according to an adaptation means. The adaptation means can include a second LMS adaptation means or a zero-forcing adaptation means. The number of tap weight coefficients of the second means for filtering can be less than or equal to the number of the tap weight coefficients of the first means for filtering. The information communication system can include either or both of means for controlling a gain of the means for amplifying in response to the second filtered signal and means for controlling a timing phase of the means for converting in response to the second filtered signal.

According to the third aspect, at least two tap weight coefficients of the first means for filtering can be constrained. The information communication system can include means for updating a value of at least one tap weight coefficient of the second means for filtering to provide a gain of the second means for filtering that is associated with a change in gain error from the first means for filtering. The information communication system can include means for modifying a gain of the means for amplifying based upon the gain of the second means for filtering, to compensate for the change in gain error from the first means for filtering means. Additionally or alternatively, the information communication system can include means for updating a value of at least one tap weight coefficient of the second means for filtering to provide a timing phase of the second means for filtering that is associated with a change in timing phase error introduced by the first means for filtering, and means for modifying a timing phase of the means for converting based upon the timing phase of the second means for filtering, to compensate for the change in timing phase error introduced by the first means for filtering.

According to the third aspect, the second means for filtering can include either a two-tap filter means or a three-tap filter means. The tap weight coefficients of the two-tap filter means can include "a" and "1+b", respectively, and the tap weight coefficients of the three-tap filter means can include "a", "1+b", and "−a", respectively. The information communication system can include means for updating the tap weight coefficient "a" according to the equation:

$$a[n+1] = a[n] - \alpha * \Delta\theta,$$

wherein $a[n+1]$ includes the value of the tap weight coefficient "a" for the next sampling time of the input signal, $a[n]$ includes the value of the tap weight coefficient "a" for the current sampling time of the input signal, $\alpha$ includes a first gain constant, and $\Delta\theta$ includes the change in timing phase associated with the first means for filtering.

According to the third aspect, the first means for filtering can include N tap weight coefficients, wherein N includes at least four. For purposes of illustration and not limitation, a third tap weight coefficient $C_3$ and a fourth tap weight coefficient $C_4$ of the first means for filtering can be constrained. The information communication system can include means for updating $\Delta\theta$ according to the equation:

$$\Delta\theta = \frac{(-\Delta C_3 * K_e - \Delta C_4 * K_o)}{K_e^2 + K_o^2},$$

wherein $\Delta C_3$ and $\Delta C_4$ are updated according to the equations:

$$\Delta C_3 = \mu * E[n] * X[n-3] \text{ and}$$

$$\Delta C_4 = \mu * E[n] * X[n-4], \text{ respectively,}$$

wherein μ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal. According to the third aspect, the means for updating the tap weight coefficients can include means for updating $K_e$ and $K_o$ according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein γ includes a "+1" when ((2*n) modulo 4)=0 and includes a "−1" otherwise, M can be determined according to the equation:

$$M = \text{TRUNCATE}((N-1)/2), \text{ and}$$

P can be determined according to the equation:

$$P = \text{TRUNCATE}(((N-1)/2) - 0.5).$$

According to the third aspect, $K_e$ and $K_o$ can each include a predetermined value.

According to the third aspect, the information communication system can include means for detecting an information sequence in the first filtered signal. The means for detecting can be responsive to an output of the first means for filtering. The information communication system can include means for reconstructing an information signal from the information sequence. The means for reconstructing can be responsive to an output of the means for detecting. The information communication system can also include means for generating an error signal. The means for generating an error signal can be responsive to the output of the first means for filtering and an output of the means for reconstructing. The means for generating an error signal can generate the error signal E[n] including a difference between the output of the first means for filtering and the output of the means for reconstructing.

According to the third aspect, the first means for filtering can include N tap weight coefficients, wherein N includes at least four. For purposes of illustration and not limitation, a third tap weight coefficient $C_3$ and a fourth tap weight coefficient $C_4$ of the first means for filtering can be constrained. The means for updating tap weight coefficients can include means for updating $\Delta\theta$ according to the equation:

$$\Delta\theta = (-\Delta C_3 * K_e - \Delta C_4 * K_o),$$

wherein $\Delta C_3$ and $\Delta C_4$ are updated according to the equations:

$$\Delta C_3 = \mu * E[n] * X[n-3] \text{ and}$$

$$\Delta C_4 = \mu * E[n] * X[n-4], \text{ respectively,}$$

wherein μ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal. According to the third aspect, the means for updating the tap weight coefficients can include means for updating $K_e$ and $K_o$ according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein γ includes a "+1" when ((2*n) modulo 4)=0 and includes a "−1" otherwise, M can be determined according to the equation:

$$M = \text{TRUNCATE}((N-1)/2), \text{ and}$$

P can be determined according to the equation:

$$P = \text{TRUNCATE}(((N-1)/2) - 0.5).$$

According to the third aspect, $K_e$ and $K_o$ can each include a predetermined value. The means for generating an error signal can generate the error signal E[n] including a difference between the output of the first means for filtering and the output of the means for reconstructing.

According to the third aspect, the information communication system can include means for updating the tap weight coefficient "b" according to the equation:

$$b[n+1] = b[n] - \beta * \Delta\Gamma,$$

wherein b[n+1] includes the value of the tap weight coefficient "b" for the next sampling time of the input signal, b[n] includes the value of the tap weight coefficient "b" for the current sampling time of the input signal, β includes a first gain constant, and $\Delta\Gamma$ includes the change in gain absent from the first means for filtering. According to the third aspect, the first means for filtering can include N tap weight coefficients, wherein N includes at least four. For purposes of illustration and not limitation, a third tap weight coefficient $C_3$ and a fourth tap weight coefficient $C_4$ of the first means for filtering can be constrained. The means for updating the tap weight coefficient can include means for updating $\Delta\Gamma$ according to equation:

$$\Delta\Gamma = \frac{(-\Delta C_3 * K_o + \Delta C_4 * K_e)}{\sqrt{K_e^2 + K_o^2}},$$

wherein $\Delta C_3$ and $\Delta C_4$ are updated according to the equations:

$$\Delta C_3 = \mu * E[n] * X[n-3] \text{ and}$$

$$\Delta C_4 = \mu * E[n] * X[n-4], \text{ respectively,}$$

wherein μ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal. According to the third aspect, the means for updating the tap weight coefficient can include means for updating $K_e$ and $K_o$ according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein $\gamma$ includes a "+1" when ((2*n) modulo 4)=0 and includes a "−1" otherwise, M can be determined according to the equation:

$M$=TRUNCATE(($N$−1)/2), and

P can be determined according to the equation:

$P$=TRUNCATE((($N$−1)/2)−0.5).

According to the third aspect, $K_e$ and $K_o$ can each include a predetermined value. The means for generating an error signal generates the error signal E[n] including a difference between the output of the first means for filtering and the output of the means for reconstructing.

According to the third aspect, the first means for filtering can include N tap weight coefficients, wherein N includes at least four. For purposes of illustration and not limitation, a third tap weight coefficient $C_3$ and a fourth tap weight coefficient $C_4$ of the first means for filtering can be constrained. The means for updating the tap weight coefficient can include means for updating ΔΓ according to the equation:

ΔΓ=(−Δ$C_3$*$K_0$+Δ$C_4$*$K_e$), wherein Δ$C_3$ and Δ$C_4$ are updated according to the equations:

Δ$C_3$=μ*$E[n]$*$X[n−3]$ and

Δ$C_4$=μ*$E[n]$*$X[n−4]$, respectively, wherein μ includes a second gain constant, E[n] includes an error signal for the current sampling time of the input signal, X[n−3] includes the value of the input signal at the third previous sampling time of the input signal, and X[n−4] includes the value of the input signal at the fourth previous sampling time of the input signal. According to the third aspect, the means for updating the tap weight coefficient can include means for updating $K_e$ and $K_o$ according to the equations:

$$K_e = \sum_{n=0}^{M} \gamma C_{2n}, \text{ and}$$

$$K_o = \sum_{n=0}^{P} \gamma C_{2n+1}, \text{ respectively,}$$

wherein $\gamma$ includes a "+1" when ((2*n) modulo 4)=0 and includes a "−1" otherwise, M can be determined according to the equation:

$M$=TRUNCATE(($N$−1)/2), and

P can be determined according to the equation:

$P$=TRUNCATE((($N$−1)/2)−0.5).

According to the third aspect, $K_e$ and $K_o$ can each include a predetermined value. The means for generating an error signal generates the error signal E[n] including a difference between the output of the first means for filtering and the output of the means for reconstructing.

According to the third aspect, the information communication system can include means for generating an error signal. The means for generating an error signal can be responsive to the output of the means for reconstructing. The means for generating an error signal can be in communication between an output of the second means for filtering and inputs of the means for controlling the gain and the means for controlling the timing phase. The first means for filtering and the second means for filtering can each include a FIR filter means. According to the third aspect, a disk drive means can include the information communication system. At least the means for amplifying, the means for converting, the first means for filtering, the second means for filtering, and at least one of the means for controlling a gain of the means for amplifying and the means for controlling a timing phase of the means for converting can be formed on a monolithic substrate. The information communication system can be compliant with a standard selected from the group consisting of 802.11, 802.11a, 802.11b, 802.11g and 802.11i.

According to a fourth aspect, an information communication system includes a variable gain amplifier (VGA) responsive to an input signal of the information communication system. The information communication system includes an analog-to-digital converter (ADC) responsive to an output of the VGA. The information communication system includes a first filter responsive to an output of the ADC. Tap weight coefficients of the first filter can be updated according to a first least mean square (LMS) engine. At least one tap weight coefficient of the first filter can be constrained. The information communication system includes a second filter responsive to an output of the first filter. The number of tap weight coefficients of the second filter can be less than or equal to the number of the tap weight coefficients of the first filter. The information communication system includes a gain controller for controlling gain of the VGA. The gain controller is in communication with the VGA and responsive to the output of the second filter.

According to a fifth aspect, an information communication system includes a variable gain amplifier (VGA) responsive to an input signal of the information communication system. The information communication system includes an analog-to-digital converter (ADC) responsive to an output of the VGA. The information communication system includes a first filter responsive to an output of the ADC. Tap weight coefficients of the first filter can be updated according to a first least mean square (LMS) engine. At least one tap weight coefficient of the first filter can be constrained. The information communication system includes a second filter responsive to an output of the first filter. The number of tap weight coefficients of the second filter can be less than or equal to the number of the tap weight coefficients of the first filter. The information communication system includes a timing phase controller for controlling timing phase of the ADC. The timing phase controller can be in communication with the ADC and responsive to an output of the second filter.

According to a sixth aspect, an information communication system includes means for amplifying an input signal received by the information communication system to generate an amplified signal. The information communication system includes means for converting the amplified signal into a digital signal to generate a converted signal. The information communication system includes first means for filtering the converted signal to generate a first filtered signal. Tap weight coefficients of the first means for filtering can be updated according to a first least mean square (LMS) adaptation means. At least one tap weight coefficient of the first means for filtering can be constrained. The information communication system includes second means for filtering the first filtered signal to generate a second filtered signal. The number of tap weight coefficients of the second means for filtering can be less than or equal to a number of the tap weight coefficients of the first means for filtering. The information communication system includes means for controlling a gain of the means for amplifying in response to the second filtered signal.

According to a sixth aspect, an information communication system includes means for amplifying an input signal received by the information communication system to generate an amplified signal. The information communication system includes means for converting the amplified signal into a digital signal to generate a converted signal. The information communication system includes first means for filtering the converted signal to generate a first filtered signal. Tap weight coefficients of the first means for filtering can be updated according to a first least mean square (LMS) adaptation means. At least one tap weight coefficient of the first means for filtering can be constrained. The information communication system includes second means for filtering the first filtered signal to generate a second filtered signal. The number of tap weight coefficients of the second means for filtering can be less than or equal to a number of the tap weight coefficients of the first means for filtering. The information communication system includes means for controlling a timing phase of the means for converting in response to the second filtered signal.

According to a seventh aspect, a computer program for controlling at least one of gain and timing phase performs the steps of: a.) filtering an input signal to generate a first filtered signal in accordance with a first plurality of filter coefficients; b.) updating the first plurality of filter coefficients according to a first least mean square (LMS) process; c.) constraining at least one filter coefficient of the first plurality of filter coefficients; d.) filtering the first filtered signal to generate a second filtered signal in accordance with a second plurality of filter coefficients, wherein the number of filter coefficients of the second plurality of filter coefficients can be less than or equal to the number of the filter coefficients of the first plurality of filter coefficients; e.) outputting a gain control signal in response to the second filtered signal; and f.) outputting a timing phase control signal in response to the second filtered signal.

BRIEF DESCRIPTION OF THE DRAWINGS

Other objects and advantages of the present disclosure will become apparent to those skilled in the art upon reading the following detailed description, in conjunction with the accompanying drawings, wherein like reference numerals have been used to designate like elements, and wherein:

FIGS. 3A and 3B are flowcharts illustrating steps for controlling at least one of gain and timing phase, in accordance with the present disclosure;

DESCRIPTION

Exemplary implementations are disclosed that include a system and/or a method for controlling gain and timing phase in the presence of a first Least Mean Square (LMS) filter using a second adaptive filter. In an information communication system, such as, for example, a receiver, a disk drive or the like, a simple secondary filter, having tap weight coefficients updated according to an adaptive algorithm such as, for example, a LMS algorithm, can be added after a primary filter, having tap weight coefficients updated according to a LMS algorithm. At least one tap weight coefficient of the primary filter can be constrained or otherwise not adapted. The simple secondary filter can be added in the loop that implements the gain control and timing phase control of the information communication system. The simple secondary filter can be, for example, a two-tap filter or a three-tap filter. The tap weight coefficients of the three-tap filter can be (a, 1+b, −a), and the tap weight coefficients of the two-tap filter can be (a, 1+b).

The simple secondary filter can introduce a slight gain difference between the output of the primary filter and the output of the simple secondary filter to allow the gain control mechanism and the LMS algorithm used to update the tap weight coefficients of the primary filter to each receive the signal amplitude level that each requires for optimal performance. In other words, the tap weight coefficient "b" of the simple secondary filter can be adapted to account for the change in gain that is "missing" from the LMS adaptation of the tap weight coefficients of the primary filter resulting from the constrained tap weight coefficients. In addition, by using a simple secondary filter, instead of, for example, a gain stage, a slight sampling phase offset can be introduced between the output of the primary filter and the output of the simple secondary filter. In other words, the tap weight coefficient "a" of the simple secondary filter can be adapted to account for the change in timing phase error associated with the primary filter as a result of the constrained tap weight coefficients. The slight sampling phase offset can be used to compensate for any bias in the timing phase recovery.

Figure 1:
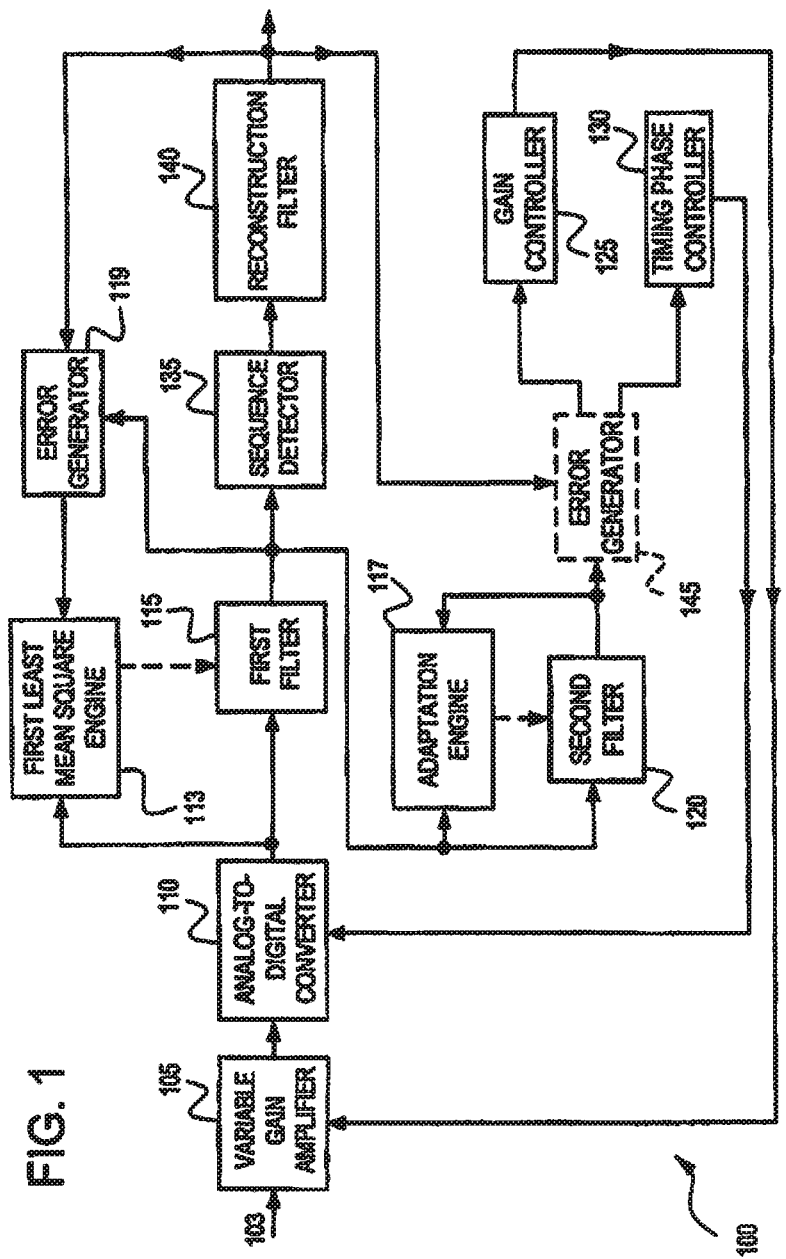
FIG. 1 is a block diagram illustrating a system for controlling gain and timing phase in the presence of a first filter using a second filter, in accordance with the present disclosure.

These and other aspects will now be described in greater detail. FIG. 1 is a block diagram illustrating a system for controlling gain and timing phase in the presence of a first filter using a second filter. An information communication system 100 includes a variable gain amplifier (VGA) 105. VGA 105 is responsive to an input signal 103 to the information communication system 100. The information communication system 100 includes an analog-to-digital converter (ADC) 110. ADC 110 is responsive to an output of VGA 105.

The information communication system 100 includes a first filter 115. The tap weight coefficients of first filter 115 are updated according to a first LMS engine 113. The first filter 115 can be, for example, a Finite Impulse Response (FIR) filter, an Infinite Impulse Response (IIR) filter, or any other suitable type of filter that can use first LMS engine 113 to update the tap weight coefficients of the filter according to the LMS algorithm. First filter 115 can be of any length (i.e., can include any desired number of tap weight coefficients), depending on, for example, the characteristics of the communicated information, the channel through which the information is communicated, the environment and application in which the information communication system 100 is used, and the like. First filter 115 is responsive to an output of ADC 110.

The information communication system 100 can include a sequence detector 135. For example, sequence detector 135 can be a Viterbi detector or the like. Sequence detector 135 is responsive to an output of first filter 115. The information communication system 100 can include a reconstruction filter 140. Reconstruction filter 140 is responsive to an output of sequence detector 135. The first LMS engine 113 is responsive to the output of ADC 110 and to an error signal generated by error generator 119. The error generator 119 is responsive to the output of first filter 115 and an output of the reconstruction filter 140. The error generator 119 generates an error signal including the difference between the output of first filter 115 and the output of the reconstruction filter 140.

The information communication system 100 includes a second filter 120. The tap weight coefficients of second filter 120 are updated according to an adaptation engine 117. The adaptation engine 117 can include, for example, a second LMS engine, a zero-forcing engine or any other suitable type of adaptive filter engine. The adaptation engine 117 can be responsive to the input of second filter 120 and the output of second filter 120. The second filter 120 can be, for example, a FIR filter, an IIR filter, or any other suitable type of filter that can use adaptation engine 117 to update the tap weight coefficients of the filter according to an adaptive algorithm. The complexity of the second filter 120 is less than or equal to the complexity of the first filter 115. In other words, the number of tap weight coefficients of the second filter 120 is less than or equal to the number of tap weight coefficients of the first filter 115. However, second filter 120 can be of any length (i.e., can include any desired number of tap weight coefficients), depending on, for example, the characteristics of the communicated information, the channel through which the information is communicated, the environment and application in which information communication system 100 is used, and the like. Second filter 120 is responsive to an output of the first filter 115.

The information communication system 100 can include a gain controller 125 for controlling the gain of VGA 105. The gain controller 125 can be a Zero-Forcing (ZF) Automatic Gain Control (AGC) or any other suitable type of AGC. Gain controller 125 is responsive to an output of the second filter 120. Gain controller 125 is in communication with VGA 105. Additionally or alternatively to gain controller 125, information communication system 100 can include a timing phase controller 130 for controlling the timing phase of ADC 110. Timing phase controller 130 is responsive to an output of the second filter 120. Timing phase controller 130 is in communication with ADC 110.

If the tap weight coefficients of first filter 115 are updated according to first LMS engine 113 using an unconstrained LMS algorithm, all tap weight coefficients of first filter 115 are adapted and the coefficients can converge to values that minimize the Mean Square Error (MSE) of the signal output by first filter 115 (assuming, for example, that gain control and timing phase recovery are stable). To remove the interaction between the LMS algorithm used to update the tap weight coefficients of the first filter 115 and the gain control and timing phase recovery algorithms used to control the VGA 105 and ADC 110, respectively, the LMS algorithm used to update the tap weight coefficients of first filter 115 (through first LMS engine 113) can be constrained in at least two dimensions. Conventionally, to provide the desired isolation between the LMS algorithm used to update the tap weight coefficients of first filter 115 and the gain control and timing phase recovery, two or more tap weight coefficients of the first filter 115 can be constrained or otherwise not adapted so as not to participate in the LMS adaptation process. At least one tap weight coefficient of the first filter 115 can be constrained, although any desired number of tap weight coefficients of the first filter 115 can be constrained or otherwise not adapted.

At least two tap weight coefficients of first filter 115 are constrained. Consequently, the value of at least one tap weight coefficient of the second filter 120 is updated to provide a gain of the second filter 120 that is associated with a change in gain error from the first filter 115. The gain of the second filter 120 is configured to cause the gain controller 125 to modify a gain of VGA 105 to compensate for the change in gain error from the first filter 115. In addition, the value of at least one tap weight coefficient of the second filter 120 is updated to provide a timing phase of the second filter 120 that is associated with a change in timing phase error introduced by the first filter 115. The timing phase of the second filter 120 is configured to cause the timing phase controller 130 to modify the timing phase of ADC 110 to compensate for the change in timing phase error introduced by the first filter 115.

The second filter 120 can include, for example, a two-tap filter or a three-tap filter, although filters of other lengths can be used, with the tap weight coefficients of the filter updated according to an adaptive algorithm. For example, the tap weight coefficients of the two-tap filter can include "a" and "1+b", respectively. The tap weight coefficients of the three-tap filter can include "a", "1+b", and "−a", respectively. The values of tap weight coefficients "a" and "b" can be set at predetermined values. However, the values of the tap weight coefficients "a" and "b" can be adapted. To adapt the tap weight coefficients "a" and "b", a characteristic gain of the first filter 115 is defined. Generally, the gain of a FIR filter, having tap weight coefficients updated according to a LMS algorithm, is a function of frequency. For example, for a magnetic recording application or the like, the signal energy is concentrated around approximately one-half the Nyquist frequency of the system.

Consequently, the characteristic gain of the first filter 115 is defined to be the gain of the first filter 115 at one-half of the Nyquist frequency, as described by Equation (2):

$$\Gamma = \sqrt{K_e^2 + K_o^2}. \tag{2}$$

In Equation (2), $K_e$ is defined according to Equation (3):

$$K_e = \sum_{n=0}^{M} \gamma C_{2n} \tag{3}$$

where $\gamma=+1$ when $((2*n)$ modulo $4)=0$, and $\gamma=-1$ otherwise. In Equation (3), each tap weight coefficient $C_{2n}$ represents the value of an even tap weight coefficient (e.g., $C_0$ is the value of the zeroeth tap weight coefficient, $C_2$ is the value of the second tap weight coefficient, etc.). If the first filter 115 includes N tap weight coefficients, M is determined according to Equation (4):

$$M = \text{TRUNCATE}((N-1)/2). \tag{4}$$

The TRUNCATE function truncates the given number to its integer portion, discarding any fractional part. Thus, for example, TRUNCATE(2.9)=2, TRUNCATE(2.5)=2, and TRUNCATE(2)=2. According to Equation (3), therefore, $K_e=C_0-C_2+C_4-C_6-$, with the length of the resulting equation (and, consequently, the value of $K_e$) depending upon the total number of (even) tap weight coefficients of first filter 115.

In Equation (2), $K_o$ is defined according to Equation (5):

$$K_o = \sum_{n=0}^{P} \gamma C_{2n+1} \tag{5}$$

where $\gamma=+1$ when $((2*n)$ modulo $4)=0$, and $\gamma=-1$ otherwise. In Equation (5), each tap weight coefficient $C_{2n+1}$ represents the value of an odd tap weight coefficient (e.g., $C_1$ is the value of the first tap weight coefficient, $C_3$ is the value of the third tap weight coefficient, etc.). If the first filter 115 includes N tap weight coefficients, P is determined according to Equation (6):

$$P = \text{TRUNCATE}(((N-1)/2)-0.5). \tag{6}$$

According to Equation (5), therefore, $K_o=C_1-C_3+C_5-C_7-$, with the length of the resulting equation (and, consequently, the value of $K_o$) depending upon the total number of (odd) tap weight coefficients of first filter 115. Highly quantized values of $K_e$ and $K_o$ (e.g., +1 or −1, or any other suitable values) can be used instead of the values calculated according to Equations (3) and (5), respectively.

As noted previously, to isolate adaptation of the LMS algorithm used to update the tap weight coefficients of first filter 115 (through first LMS engine 113) from gain controller 125 and timing phase controller 130, two or more of the tap weight coefficients of first filter 115 are constrained. However, constraining the tap weight coefficients can result in the loss of the change in gain that the constrained tap weight coefficients would have contributed. The first filter 115 can include N tap weight coefficients, where N can include at least four, although N can be any number greater than zero. A third tap weight coefficient $C_3$ and a fourth tap weight coefficient $C_4$ of the first filter 115 are constrained, although additional and/or alternative tap weight coefficients can be constrained. For purposes of illustration and not limitation, if $C_3$ and $C_4$ are the constrained tap weight coefficients, then the missing gain change is represented by Equation (7):

$$\Delta\Gamma = \frac{(-\Delta C_3 * K_o + \Delta C_4 * K_e)}{\Gamma}. \tag{7}$$

In Equation (7), $\Delta C_3$ is updated according to Equation (8), and $\Delta C_4$ is updated according to Equation (9), as follows:

$$\Delta C_3 = \mu * E[n] * X[n-3] \tag{8}$$

$$\Delta C_4 = \mu * E[n] * X[n-4]. \tag{9}$$

In Equations (8) and (9), μ includes a gain constant or step-size parameter and can be any suitable value, such as, for example, any value between zero and one or any appropriate value. E[n] includes an error signal for the current sampling time of the input signal 103, representing the difference between the output of the first filter 115 and the output of the reconstruction filter 140. X[n−3] includes the value of the input signal 103 at a third previous (time-delayed) sampling time of the input signal 103, and X[n−4] includes the value of the input signal 103 at a fourth previous (time-delayed) sampling time of the input signal 103.

In Equation (7), $\Delta\Gamma$ represents the change in gain error from the adaptation of the LMS algorithm used to update the tap weight coefficients of first filter 115 due to the constraint of tap weight coefficients $C_3$ and $C_4$. Equation (7) can be modified to represent the gain change error due to the constraint of additional and/or alternative tap weight coefficients. For example, if more than two tap weight coefficients are constrained, Equation (7) can include the $\Delta C$ term(s) for the additional tap weight coefficients, with the polarity of each $\Delta C$ term corresponding to the polarity of the tap weight coefficient as represented in Equations (3) and (5) for $K_e$ and $K_o$, respectively. In addition, common terms that are nearly constant or are large in magnitude can be dropped from Equation (7). Consequently, for purposes of illustration and not limitation, the following simplified equation represents the gain change error resulting from the constraint of tap weight coefficients $C_3$ and $C_4$ of first filter 115:

$$\Delta\Gamma = (-\Delta C_3 * K_o + \Delta C_4 * K_e) \tag{10}$$

In Equation (10), $\Delta C_3$ and $\Delta C_4$ are updated according to Equations (8) and (9), respectively, and Ke and Ko are updated according to Equations (3) and (5), respectively.

The gain change error $\Delta\Gamma$ can cause the improper functioning of, for example, a ZF AGC algorithm in the presence of the constrained LMS algorithm used to update the tap weight coefficients of the first filter 115. To allow the LMS algorithm used to update the tap weight coefficients of the first filter 115 to converge properly, the amplitude of the signal input to first filter 115 can be adjusted. For example, if $\Delta\Gamma$ is positive, then the amplitude of the output of VGA 105 can be increased to compensate for the amount of the gain change error. The compensation can be accomplished by, for example, reducing the gain of the second filter 120 by the amount $-\Delta\Gamma$. This reduction in the amplitude of the signal output by second filter 120 causes the gain controller 125 to increase the gain of VGA 105 by the corresponding amount. The resultant higher gain value of VGA 105 results in an increase to the signal amplitude of input signal 103, thereby increasing the signal amplitude of the signal output by first filter 115.

Thus, the tap weight coefficient "b" of second filter 120 is updated according to Equation (11):

$$b[n+1]=b[n]-\beta*\Delta\Gamma \qquad (11)$$

In Equation (11), b[n+1] includes the value of the tap weight coefficient "b" for the next sampling time of the input signal 103, while b[n] includes the value of the tap weight coefficient "b" for the current sampling time of the input signal 103. The gain constant β can be any suitable value, such as, for example, any value between zero and one or any appropriate value. The gain change error from the first filter 115, ΔΓ, is determined according to, for example, Equation (7), Equation (10) or a modified version of either Equation (7) or Equation (10) that accounts for additional and/or alternative constrained tap weight coefficients of first filter 115.

Additionally, there can be a timing phase rotation or error as a result of the constrained LMS algorithm used to update the tap weight coefficients of first filter 115. For example, for a signal component located at approximately one-half the Nyquist frequency of the system, the timing phase rotation or error introduced by the LMS algorithm used to update the tap weight coefficients of first filter 115 can be considered substantially equivalent to the timing phase rotation or error for a two-tap filter with tap weight coefficients ($K_e$, $K_o$). The phase angle for such a filter at approximately one-half the Nyquist frequency would be $TAN^{-1}(K_o/K_e)$. The first filter 115 can include N tap weight coefficients, where N can include at least four, although N can be any number greater than zero. A third tap weight coefficient $C_3$ and a fourth tap weight coefficient $C_4$ of the first filter 115 are constrained, although additional and/or alternative tap weight coefficients can be constrained. For purposes of illustration and not limitation, if $C_3$ and $C_4$ are the constrained tap weight coefficients, then the timing phase error introduced by first filter 115 is represented by Equation (12):

$$\Delta\theta = \frac{(-\Delta C_3 * K_e - \Delta C_4 * K_o)}{K_e^2 + K_o^2}. \qquad (12)$$

In Equation (12), $\Delta C_3$ is updated according to Equation (8), $\Delta C_4$ is updated according to Equation (9), and $K_e$ and $K_o$ is updated according to Equations (3) and (5), respectively.

In Equation (12), Δθ represents the change in timing phase error that has been introduced by the LMS algorithm used to update the tap weight coefficients of first filter 115 due to the constraint of tap weight coefficients $C_3$ and $C_4$. Equation (12) can be modified to represent the change in timing phase error due to the constraint of additional and/or alternative tap weight coefficients. For example, if more than two taps are constrained, Equation (12) can include the ΔC term(s) for the additional tap weight coefficients. In addition, common terms that are nearly constant or are large in magnitude can be dropped from Equation (12). Consequently, for purposes of illustration and not limitation, the following simplified equation represents the timing phase error resulting from the constraint of tap weight coefficients $C_3$ and $C_4$ of first filter 115:

$$\Delta\theta=(-\Delta C_3*K_e-\Delta C_4*K_o) \qquad (13)$$

In Equation (13), $\Delta C_3$ and $\Delta C_4$ are updated according to Equations (8) and (9), respectively, and $K_e$ and $K_o$ are updated according to Equations (3) and (5), respectively.

To allow the LMS algorithm used to update the tap weight coefficients of the first filter 115 to converge properly, the timing phase of the signal input to first filter 115 is adjusted. For example, if Δθ is positive, then the timing phase of the signal output by ADC 110 is shifted or otherwise adjusted to compensate for the amount of the timing phase error. The compensation can be accomplished by, for example, rotating or otherwise adjusting the timing phase of the second filter 120 by the amount -Δθ. This rotation in the timing phase of the signal output by second filter 120 causes the timing phase controller 130 to rotate or otherwise adjust the timing phase of ADC 110 in the opposite direction by a corresponding amount. The resultant timing phase rotation or adjustment of ADC 110 results in a rotation of the timing phase of input signal 103, thereby rotating or adjusting the timing phase of the signal output by first filter 115.

Thus, the tap weight coefficient "a" of second filter 102 is updated according to Equation (14):

$$a[n+1]=a[n]-\alpha*\Delta\theta, \qquad (14)$$

In Equation (14), a[n+1] includes the value of the tap weight coefficient "a" for the next sampling time of the input signal 103, while a[n] includes the value of the tap weight coefficient "a" for the current sampling time of the input signal 103. The gain constant α can be any suitable value, such as, for example, any value between zero and one or any appropriate value. The change in timing phase error associated with first filter 115, Δθ, is determined according to, for example, Equation (12), Equation (13) or a modified version of either Equation (12) or Equation (13) that accounts for additional and/or alternative constrained tap weight coefficients of first filter 115.

Information communication system 100 can optionally include an error generator 145. Error generator 145 is responsive to the output of reconstruction filter 140. Error generator 145 is in communication with an output of second filter 120 and inputs of either or both gain controller 125 and timing phase controller 130. Instead of a separate error generator 145, gain controller 125 can include an error generator. Gain controller 125 can then be responsive to the output of reconstruction filter 140. Timing phase controller 130 can also include an error generator, instead of a separate error generator 145. Consequently, timing phase controller 130 can also be responsive to the output of reconstruction filter 140.

Figure 2:
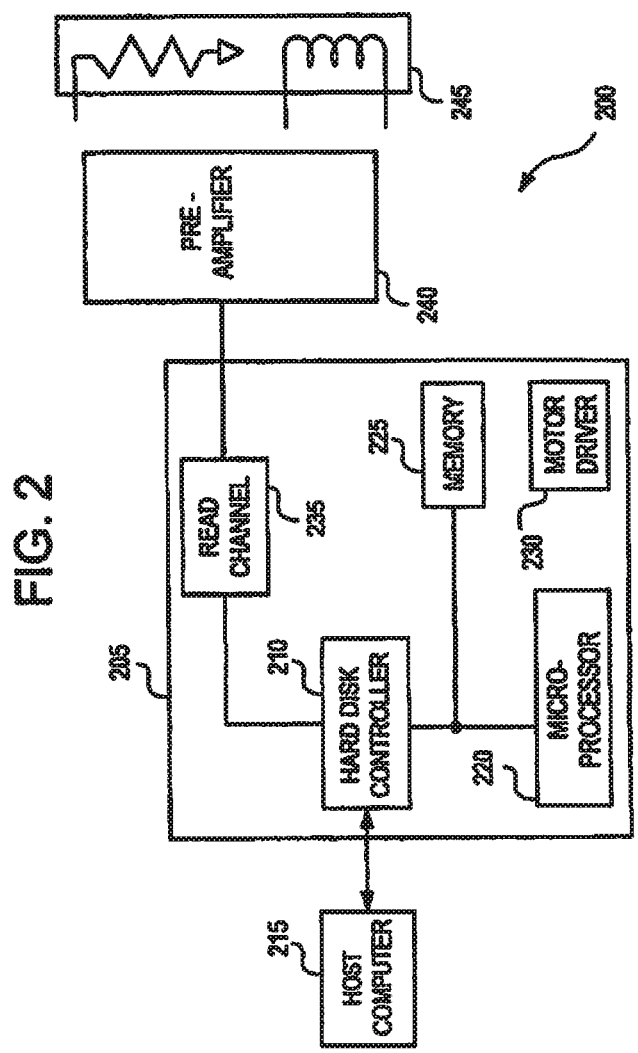
FIG. 2 is a functional block diagram of a disk drive system, in accordance with the present disclosure.

A disk drive can include the information communication system 100. FIG. 2 is a functional block diagram of a disk drive system 200. The disk drive system 200 includes a disk drive 205 that can be of, for example, a 2-, 4- or 8-channel configuration or any other suitable configuration. The disk drive 205 includes a hard disk controller (HDC) 210 that interfaces with a host device, such as a host computer 215, and further includes a microprocessor 220 and memory 225, each in communication with the HDC 210. A motor driver 230 is also provided. Disk drive 205 also includes a read channel 235, the output of which is supplied to the HDC 210. A pre-amplifier integrated circuit 240 generates an output signal that is supplied as an input to the read channel 235. The pre-amplifier is in communication with a recording head 245, which can be, for example a Magneto-Resistive (MR) or Giant Magneto-Resistive (GMR) recording head or any other suitable recording head. For example, the implementations disclosed herein can be used in or by, for example, read channel 235 or any other suitable component of disk drive system 200, and/or can be performed by the combination of microprocessor 220 and memory 225.

Additionally, implementations disclosed herein can be used, for example, for communicating information over noisy communication channels and the like. For example, information communication system 100 can be compliant with a standard selected from the group consisting of 802.11, 802.11a, 802.11b, 802.11g and 802.11i, or any other suitable wired or wireless standard. However, information communication system 100 can be used in any device or system that communicates information, including both wired and wireless communication systems, read channel devices, disk drive systems (e.g., those employing read channel devices), other magnetic storage or recording applications, and the like, particularly in systems and devices where a substantial portion of the signal energy in the communicated information signal is located at approximately one-half of the Nyquist frequency of the system.

The input signal 103 can be any suitable type of electrical signal that is capable of communicating electrical information. VGA 105, ADC 110, first filter 115, first LMS engine 113, error generator 119, second filter 120, adaptation engine 117, gain controller 125, timing phase controller 130, sequence detector 135, reconstruction filter 140 and error generator 145 can each be implemented using any suitable means for performing the functions associated with the respective element. VGA 105, ADC 110, first filter 115, first LMS engine 113, error generator 119, second filter 120, adaptation engine 117, gain controller 125, timing phase controller 130, sequence detector 135, reconstruction filter 140 and error generator 145, or any combination thereof, can be formed on, for example, a monolithic substrate. Alternatively, each element, or any combination thereof, can be any suitable type of electrical or electronic component or device that is capable of performing the functions associated with the respective element. Each component or device can be in communication with another component or device using any appropriate type of electrical connection that is capable of carrying electrical information.

Those of ordinary skilled will recognize that the information communication system 100 can include any additional electrical or electronic components, devices or elements that can be used for communicating information signals, including mixers, local oscillators, demodulators, modulators, phase locked loops, power amplifiers, power supplies, additional filters, or any other appropriate components, devices or elements in any suitable combination that can be used for communicating information signals, depending upon the nature and type of information signals to be communicated and the environment in which the information communication system 100 is to be used. For example, the information communication system 100 can form the receiver portion of a transceiver system for transmitting and receiving information, can form portion of a disk drive or other magnetic storage or recording device, or the like.

Figure 3B:
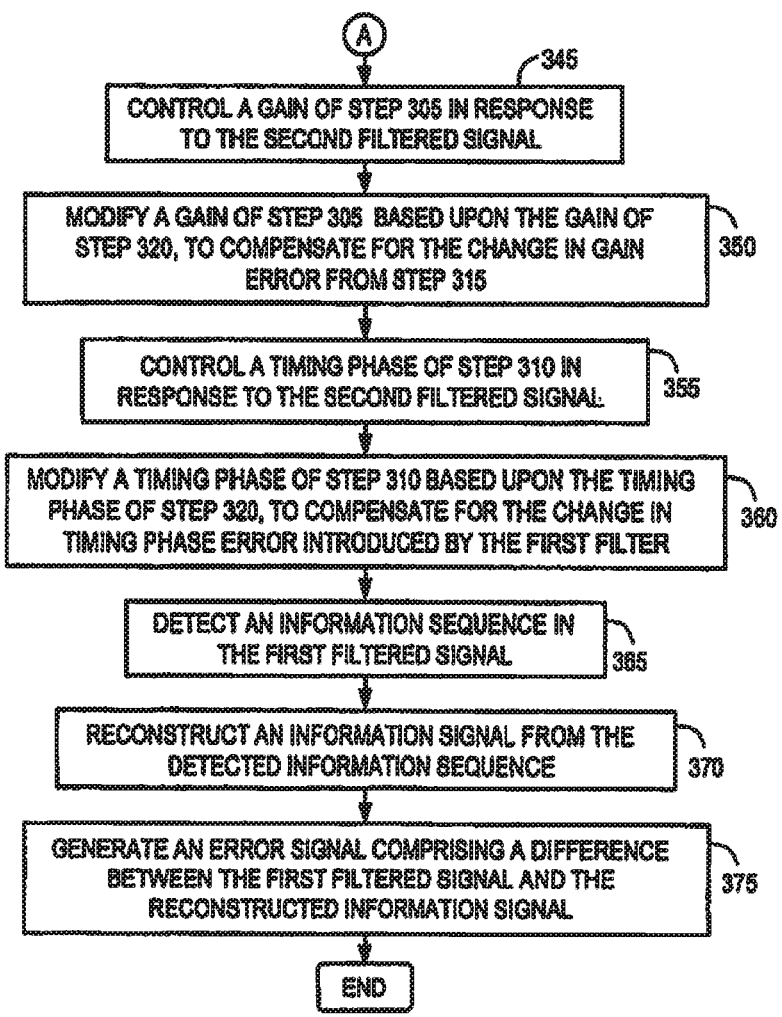

FIGS. 3A and 3B are flowcharts illustrating steps for controlling at least one of gain and timing phase. In step 305 of FIG. 3A, an input signal is amplified to generate an amplified signal. In step 310, the amplified signal is converted into a digital signal to generate a converted signal.

In step 315, the converted signal is filtered to generate a first filtered signal in accordance with a first plurality of filter coefficients. The first plurality of filter coefficients are updated according to a first LMS process. The first plurality of filter coefficients can be of any number (i.e., can include any desired number of filter coefficients). At least one filter coefficient of the first plurality of filter coefficients can be constrained. For example, two or more filter coefficients of the first plurality of filter coefficients can be constrained.

In step 320, the first filtered signal is filtered to generate a second filtered signal in accordance with a second plurality of filter coefficients. For example, the second plurality of filter coefficients can be updated according to an adaptation process, such as, for example, a second LMS process, a zero-forcing process, or any other suitable adaptation process. The number of filter coefficients of the second plurality of filter coefficients is less than or equal to the number of the filter coefficients of the first plurality of filter coefficients. For example, the second plurality of filter coefficients can include two or three filter coefficients. However, the second plurality of filter coefficients can be of any number (i.e., can include any desired number of filter coefficients).

In step 325, a value of at least one filter coefficient of the second plurality of filter coefficients is updated to provide a timing phase of Step 320 that is associated with a change in timing phase error introduced by Step 315. The two filter coefficients of the second plurality of filter coefficients can include "a" and "1+b", respectively, and the three filter coefficients of the second plurality of filter coefficients can include "a", "1+b", and "−a", respectively. In step 330, the filter coefficient "a" of the second plurality of filter coefficients is updated according to Equation (14). In step 335, a value of at least one filter coefficient of the second plurality of filter coefficients is updated to provide a gain of Step 320 that is associated with a change in gain error from Step 315. In step 340, the filter coefficient "b" of the second plurality of filter coefficients is updated according to Equation (11).

In step 345 of FIG. 3B, a gain of Step 305 is controlled in response to the second filtered signal. In step 350, a gain of Step 305 is modified based upon the gain of Step 320, to compensate for the change in gain error from Step 315. In step 355, a timing phase of Step 310 is controlled in response to the second filtered signal. In step 360, a timing phase of Step 310 is modified based upon the timing phase of Step 320, to compensate for the change in timing phase error introduced by Step 315.

In step 365, an information sequence is detected in the first filtered signal. In step 370, an information signal is reconstructed from the detected information sequence. In step 375, an error signal is generated that includes a difference between the first filtered signal and the reconstructed information signal.

Figure 4:
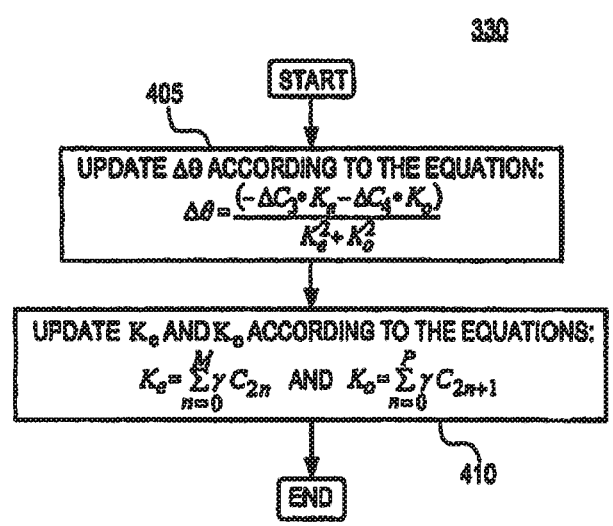
FIG. 4 is a flowchart illustrating steps for updating a filter coefficient "a" of a second plurality of filter coefficients, in accordance with the present disclosure.

FIG. 4 is a flowchart illustrating steps for updating a filter coefficient "a" of the second plurality of filter coefficients. The first plurality of filter coefficients can include N filter coefficients, wherein N includes at least four, although N can be any number greater than zero. For example, a third filter coefficient $C_3$ and a fourth filter coefficient $C_4$ of the first plurality of filter coefficients can be constrained. In step 405, $\Delta\theta$ is updated according to Equation (12). In step 410, $K_e$ and $K_o$ are updated according to Equations (3) and (5), respectively. $K_e$ and $K_o$ can each include a predetermined value.

Figure 5:
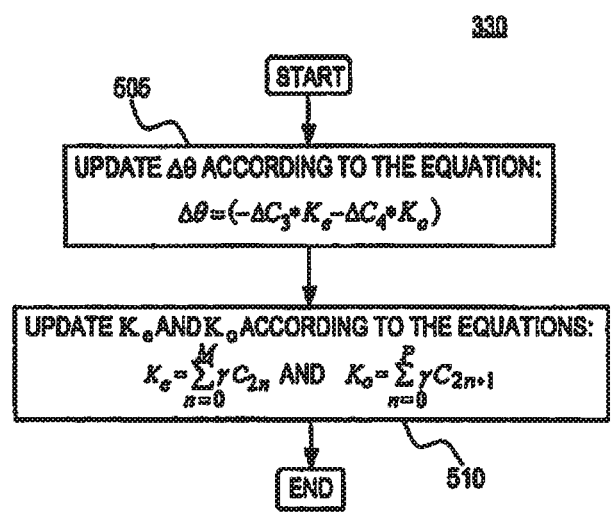
FIG. 5 is a flowchart illustrating steps for updating a filter coefficient "a" of a second plurality of filter coefficients, in accordance the present disclosure.

FIG. 5 is a flowchart illustrating steps for updating a filter coefficient "a" of the second plurality of filter coefficients. In step 505, $\Delta\theta$ is updated according to Equation (13). In step 510, $K_e$ and $K_o$ are updated according to Equations (3) and (5), respectively. $K_e$ and $K_o$ can each include a predetermined value.

Figure 6:
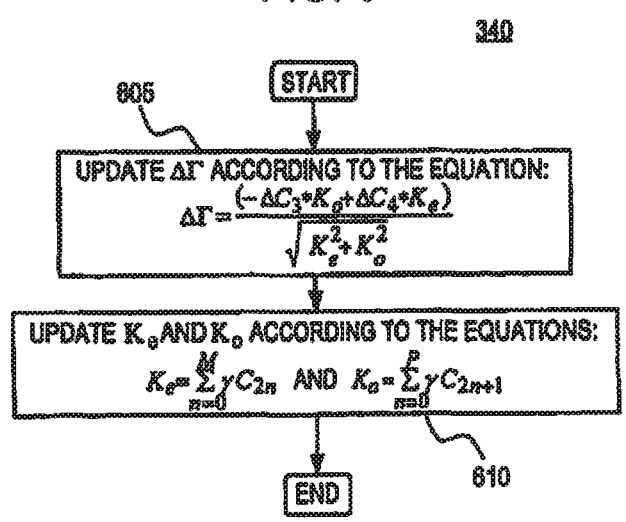
FIG. 6 is a flowchart illustrating steps for updating a filter coefficient "b" of a second plurality of filter coefficients, in accordance with the present disclosure.

FIG. 6 is a flowchart illustrating steps for updating a filter coefficient "b" of the second plurality of filter coefficients. The first plurality of filter coefficients can include N filter coefficients, wherein N includes at least four, although N can be any number greater than zero. For example, a third filter coefficient $C_3$ and a fourth filter coefficient $C_4$ of the first plurality of filter coefficients can be constrained. In step 605, $\Delta\Gamma$ is updated according to Equation (7). In step 610, $K_e$ and $K_o$ are updated according to Equations (3) and (5), respectively. $K_e$ and $K_o$ can each include a predetermined value.

Figure 7:
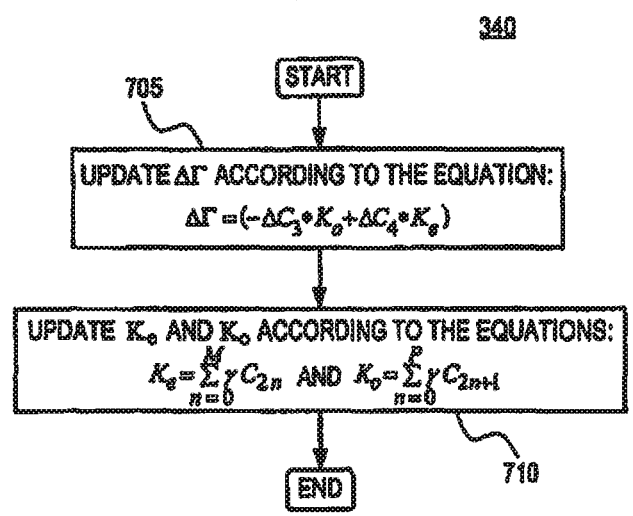
FIG. 7 is a flowchart illustrating steps for updating a filter coefficient "b" of a second plurality of filter coefficients, in accordance with the present disclosure.

FIG. 7 is a flowchart illustrating steps for updating a filter coefficient "b" of the second plurality of filter coefficients. In step 705, ΔΓ is updated according to Equation (10). In step 710, $K_e$ and $K_o$ are updated according to Equations (3) and (5), respectively. $K_e$ and $K_o$ can each include a predetermined value.

Any or all of the steps of a computer program as illustrated in FIGS. 3A, 3B, and 4-7 for controlling at least one of gain and timing phase can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

It will be appreciated by those of ordinary skill in the art that the implementations disclosed herein can be embodied in various specific forms without departing from the spirit or essential characteristics thereof. The presently disclosed implementations are considered in all respects to be illustrative and not restrictive.

All United States patents and applications, foreign patents, and publications discussed above are hereby incorporated herein by reference in their entireties.

What is claimed is:

1. A system comprising:
    a first filter circuit including a first plurality of taps, wherein the first plurality of taps are to receive a first plurality of coefficients, wherein the first filter circuit is to filter a digital signal to generate a first filtered signal, wherein one or more of the first plurality of coefficients are constrained, such that (i) the one or more of the first plurality of coefficients are not updated, (ii) a phase error is introduced, and (iii) a gain error is introduced;
    a second filter circuit including a second plurality of taps, wherein the second plurality of taps are to receive a second plurality of coefficients, wherein the second filter circuit is to filter the first filtered signal to generate a second filtered signal, and wherein the second plurality of coefficients comprises a first coefficient and a second coefficient; and
    an adaptation engine to, based on the one or more of the first plurality of coefficients, update (i) the first coefficient to set a phase of the second filter circuit, wherein the phase of the second filter circuit corresponds to a change in the phase error introduced by the first filter circuit, and (ii) the second coefficient to set a gain of the second filter circuit, wherein the gain of the second filter circuit corresponds to a change in the gain error introduced by the first filter circuit.

2. The system of claim 1, further comprising:
    an amplifier to (i) receive an input signal, and (ii) amplify the input signal to provide an amplified input signal;
    an analog-to-digital converter to convert the amplified input signal to the digital signal;
    a gain controller adjusting a gain of the amplifier based on the second filtered signal; and
    a phase controller to adjust a phase of the analog-to-digital converter based on the second filtered signal.

3. The system of claim 1, wherein:
    the one or more of the first plurality of coefficients include a third coefficient and a fourth coefficient; and
    the adaptation engine is to update (i) the first coefficient based on a change in the third coefficient and a change in the fourth coefficient, and (ii) the second coefficient based on a change in the third coefficient and a change in the fourth coefficient.

4. The system of claim 1, wherein:
    the adaptation engine is to update the first coefficient and the second coefficient based on a plurality of predetermined values; and
    each of the plurality of predetermined values is based on corresponding ones of the first plurality of coefficients.

5. The system of claim 4, wherein:
    the plurality of predetermined values comprises a first value and a second value;
    the first value is based on even ones of the first plurality of coefficients; and
    the second value is based on odd ones of the first plurality of coefficients.

6. The system of claim 5, wherein the adaptation engine is to determine the change in the phase error based on a sum of (i) the first value squared, and (ii) the second value squared.

7. The system of claim 5, wherein the adaptation engine is to determine the change in the gain error based on a sum of (i) the first value squared, and (ii) the second value squared.

8. The system of claim 7, wherein the adaptation engine is to determine the change in the gain error based on a square root of the sum of (i) the first value squared, and (ii) the second value squared.

9. The system of claim 4, wherein:
    the adaptation engine is to determine the change in the phase error based on a sum of products; and
    each of the products is of (i) a change in one of the first plurality of coefficients, and (ii) one of the plurality of values.

10. The system of claim 4, wherein:
    the adaptation engine is to determine the change in the gain error based on a sum of products; and
    each of the products is of (i) a change in one the first plurality of coefficients, and (ii) one of the plurality of values.

11. A method comprising:
    receiving a digital signal at a first filter circuit;
    receiving a first plurality of coefficients at a first plurality of taps of the first filter circuit;
    filtering the digital signal via the first filter circuit to generate a first filtered signal, wherein one or more of the first plurality of coefficients are constrained, such that (i) the one or more of the first plurality of coefficients are not updated, (ii) a phase error is introduced, and (iii) a gain error is introduced;
    receiving the first filtered signal at a second filter circuit;
    receiving a second plurality of coefficients at a second plurality of taps of the second filter circuit, wherein the second plurality of coefficients comprises a first coefficient and a second coefficient;

filtering the first filtered signal via the second filter circuit to generate a second filtered signal;

updating the first coefficient to set a phase of the second filter circuit based on the one or more of the first plurality of coefficients, wherein the phase of the second filter circuit corresponds to a change in the phase error introduced by the first filter circuit; and updating the second coefficient to set a gain of the second filter circuit based on the one or more of the first plurality of coefficients, wherein the gain of the second filter circuit corresponds to a change in the gain error introduced by the first filter circuit.

12. The method of claim 11, further comprising:

amplifying an input signal to provide an amplified input signal;

converting the amplified input signal to the digital signal via an analog-to-digital converter;

adjusting a gain of the amplifier based on the second filtered signal; and adjusting a phase of the analog-to-digital converter based on the second filtered signal.

13. The method of claim 11, comprising updating (i) the first coefficient based on a change in a third coefficient and a change in a fourth coefficient, and (ii) the second coefficient based on a change in the third coefficient and a change in the fourth coefficient, wherein the one or more of the first plurality of coefficients include the third coefficient and the fourth coefficient.

14. The method of claim 11, comprising updating the first coefficient and the second coefficient based on a plurality of predetermined values, wherein each of the plurality of predetermined values is based on corresponding ones of the first plurality of coefficients.

15. The method of claim 14, wherein:

the plurality of predetermined values comprises a first value and a second value;

the first value is based on even ones of the first plurality of coefficients; and the second value is based on odd ones of the first plurality of coefficients.

16. The method of claim 15, further comprising determining the change in the phase error based on a sum of (i) the first value squared, and (ii) the second value squared.

17. The method of claim 15, further comprising determining the change in the gain error based on a sum of (i) the first value squared, and (ii) the second value squared.

18. The method of claim 17, comprising determining the change in the gain error based on a square root of the sum of (i) the first value squared, and (ii) the second value squared.

19. The method of claim 14, further comprising determining the change in the phase error based on a sum of products, wherein each of the products is of (i) a change in one of the first plurality of coefficients, and (ii) one of the plurality of values.

20. The method of claim 14, further comprising determining the change in the gain error based on a sum of products, wherein each of the products is of (i) a change in one the first plurality of coefficients, and (ii) one of the plurality of values.

* * * * *